United States Patent [19]

Nakasho

[11] Patent Number: 4,464,794
[45] Date of Patent: Aug. 7, 1984

[54] INDICATOR DEVICE

[75] Inventor: Kazuo Nakasho, Tokyo, Japan

[73] Assignee: Olympus Optical Co., Ltd., Tokyo, Japan

[21] Appl. No.: 529,981

[22] Filed: Sep. 7, 1983

Related U.S. Application Data

[63] Continuation of Ser. No. 261,510, May 7, 1981, abandoned.

[30] Foreign Application Priority Data

May 9, 1980 [JP] Japan .............................. 55-63336[U]
May 9, 1980 [JP] Japan .............................. 55-63337[U]

[51] Int. Cl.³ .............................................. H04B 1/16
[52] U.S. Cl. .................................... 455/157; 455/350;
334/86; 116/245; 116/309
[58] Field of Search ................... 334/86; 455/154, 157,
455/347, 350, 351; 116/245, 248, 249, 254, 255,
309; 74/553, 10.8; 312/7.1

[56] References Cited

U.S. PATENT DOCUMENTS

| D. 133,582 | 8/1942 | Dewey | 312/7.1 |
|---|---|---|---|
| 1,577,714 | 3/1926 | Hayden | 116/254 |
| 2,445,211 | 7/1948 | Drake | 74/553 |
| 2,571,498 | 10/1951 | Temple | 116/254 |
| 2,630,526 | 3/1953 | Zelov | 312/7.1 |

FOREIGN PATENT DOCUMENTS

| 720318 | 4/1942 | Fed. Rep. of Germany | 455/350 |
|---|---|---|---|
| 2855701 | 12/1979 | Fed. Rep. of Germany | 334/86 |
| 665738 | 1/1964 | Italy | 455/157 |

Primary Examiner—Gerald Goldberg
Assistant Examiner—John E. Chapman, Jr.
Attorney, Agent, or Firm—Toren, McGeady and Stanger

[57] ABSTRACT

A tuning assembly for a television or radio receiver comprises a rotatable ring located around a built-in loudspeaker. The rotatable ring operates to drive a variable capacitor through a geared transmission mechanism so that a pointer mounted either on the ring or on the case of the receiver can be moved relative to dial scale indicia located on the other of either the ring or the case, providing an indication of the frequency to which the receiver is tuned.

5 Claims, 9 Drawing Figures

INDICATOR DEVICE

This is a continuation of application Ser. No. 261,510, filed May 7, 1981 and abandoned.

BACKGROUND OF THE INVENTION

1. Field of the Invention

The present invention relates to an indicator device in particular, an indicator device that can minimize the size of electronics devices such as radio receivers.

2. Description of Prior Art

At present, an indicator device with a turning mechanism is most widely used in devices such as portable radio receivers. The indicator device has a turning string or belt between the pulley on a turning knob and a pulley on the rotatable shaft of a variable capacitor so that rotation of the turning knob can be transferred to the variable capacitor through the use of the frictional resistance of the string. The tuning string is connected to a pointer to provide linear movement of the pointer on a dial scale which displays AM, SW or FM tuning indicia. With this mechanism a listener can tune a desired radio station.

The conventional indicator device with a separate tuning mechanism requires a rather large AM, SW and-/or FM dial scale at the front of the radio receiver. This device also must be located far from the speaker, and thus the size of the radio receiver is usually enlarged. In a portable radio receiver, for example, small indicia necessitated by the limited size of the radio makes it difficult to read the display.

SUMMARY OF THE INVENTION

An object of the present invention is to eliminate the above described defect of an indicator device.

Another object is to minimize the size of a receiver by providing an indicator device which is easy to read and simple to adjust.

Still another object is to provide an indicator device which enables a receiver to be more modern in its external design.

According to the present invention, the indicator device comprises an indicator window located on the case of the receiver arranged around the built-in loudspeaker, a rotatable ring mounted on the case, a tuning knob that can drive the ring via a rotation transfer mechanism, a pointer mounted either on the ring or on the case, and tuning indicia located on the remaining space of either the ring or the case in cooperative relationship with the pointer. The display unit may be mounted either around the indicator window or on the ring inside the indicator window. A portion of the indicator window or the entire window, is covered with a transparent material.

In accordance with another embodiment of the present invention, the tuning knob may be rotatably mounted on the case of the receiver around the built-in speaker, with the pointer being mounted either on the tuning knob or on the case. The tuning indicia may be located either on the tuning knob or on the case, and the transfer mechanism for driving the unit to be controlled is structured in accordance with the tuning knob. The tuning knob is formed as a ring and may be convex. In some cases, the tuning knob has the pointer inside the knob and the tuning indicia is mounted on the case, and in others, the reverse mounting may be made. Some rotation transfer mechanisms may have a fine-tuning mechanism.

DESCRIPTION OF THE DRAWINGS

In the drawings

FIG. 3b is a front elevation of the mechanism of FIG. 3a;

FIG. 4b is a sectional view of the embodiment of FIG. 4a;

FIG. 5b is a front elevation of the device shown in FIG. 5a.

DESCRIPTION OF THE PREFERRED EMBODIMENT

Figure 1A:
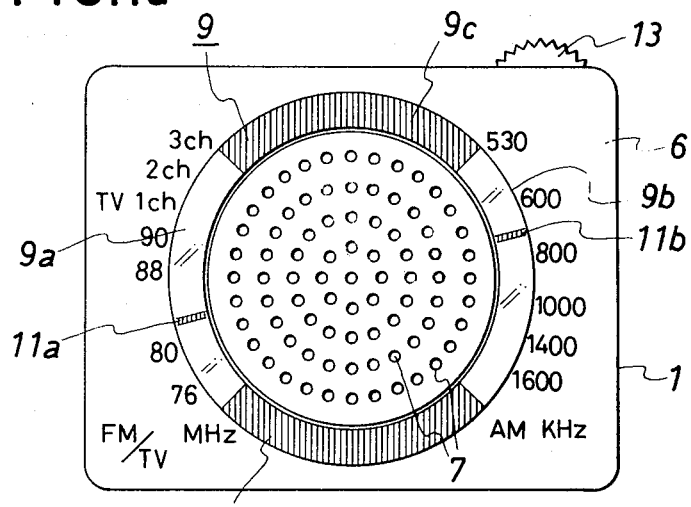
FIG. 1a is a front view of an embodiment of the present invention.
Figure 1B:
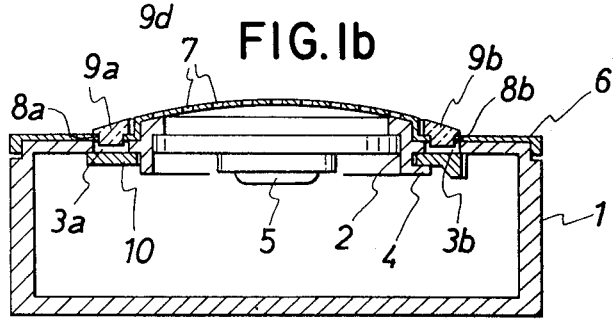
FIG. 1b is a sectional view of the invention.

FIGS. 1a and 1b depict the indicator device under the present invention for application in a small, portable radio receiver. No circuit configuration is shown.

In FIGS. 1(a) and (b), 1 is a case of the radio receiver, and an aperture 2 for the speaker is formed almost at the center of the case 1. A pair of arched slits 3a and 3b, which face each other, are formed along the circumference of aperture 2 for the speaker. L-shaped protrusions 4 equally spaced 120° apart, as shown in FIG. 2, are formed to face into case 1.

Speaker 5 is mounted on aperture 2 and as shown in FIG. 1b, a speaker panel 6 is mounted on the case to cover speaker 5. The speaker panel 6 has a spherical protrusion 7 for the speaker 5. This protruded panel 7 has a multiplicity of sound transmitting holes. Arched slits 8a and 8b are mounted on panel 6 in accordance with slits 3a and 3b on the case 1.

A circular, indicator window 9 is mounted along slits 8a and 8b. Indicator window 9 has transparent areas 9a and 9b, and has opaque areas 9c and 9d intermittently arranged. Here, the transparent areas 9a and 9b correspond to slits 8a and 8b. Dial scales or tuning indicia for an AM, FM and/or TV receiving signal display are mounted at the outside of the transparent areas 9a and 9b of indicator window 9.

Figure 2:
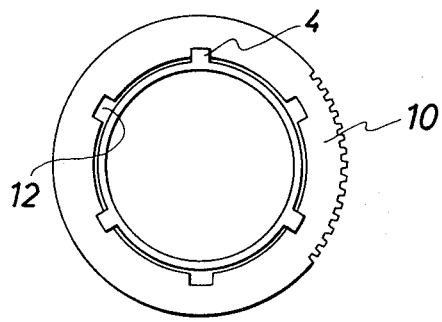
FIG. 2 is a bottom view of parts of the device shown in FIGS. 1a and 1b.
Figure 3A:
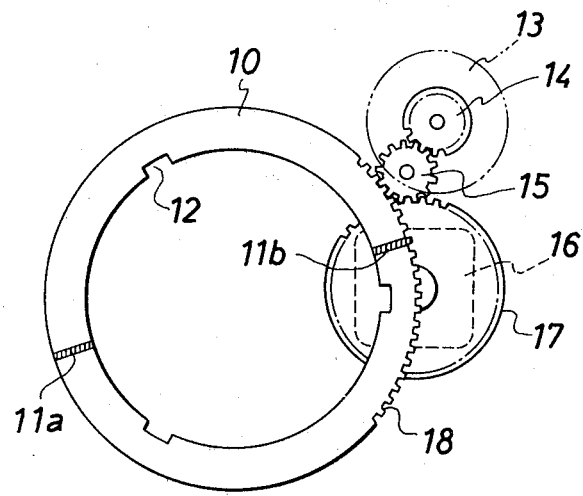
FIG. 3a is a schematic diagram showing a rotation transfer mechanism in accordance with the invention.
Figure 3B:
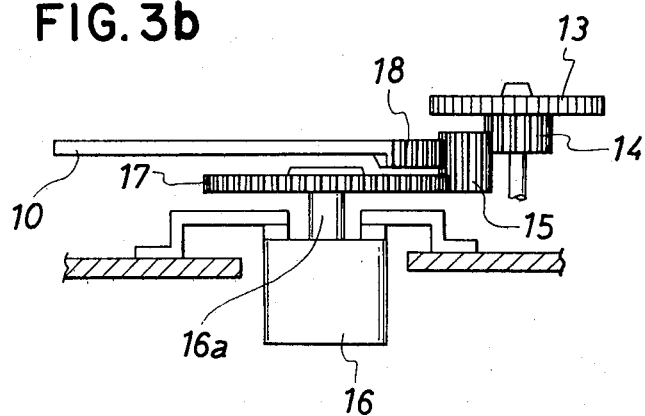

Shown in FIG. 2 is a ring 10 which has notches 12 at intervals of 120° and which incorporates pointers or markers 11a and 11b. Notch 12 corresponds to protrusion 4 in loose fit allowing the aperture 2 for the speaker to be held rotatably. Ring 10 is interconnected to tuning knob 13 via a gear transmission mechanism such as shown in FIG. 3(a) and (b) to provide controllability of the tuning mechanism from the outside of the case 1 of the radio receiver. The gear transmission mechanism allows a first gear 14, which is fixed on tuning knob 13, to mesh with a second gear 17, which is fixed on rotatable shaft 16a of a variable capacitor 16 through a transmission gear 15. Furthermore, transmission gear 15 is in mesh with a third gear 18 which is formed on ring 10.

The operation of the indicator device of the present invention will be explained next. When one of the AM, FM and TV frequency bands is tuned by rotating the tuning knob 13, which protrudes from case 1 of the radio receiver, the rotation of the knob 13 is transferred to the second gear 17 and to the gear 18 via transmission gear 15. Ring 10 rotates, whereby pointers 11a and 11b slide along transparent areas 9a and 9b of indicator window 9. This allows the operator to easily tune the desired frequency by looking at the display unit.

In this configuration, since indicator window 9 and the display unit are located outside the speaker 5, no display unit is required to be mounted apart from speaker 5. This reduces the size and thickness of the radio receiver and leads to better space utilization. The larger display unit on the relatively small device allows the operator to perform easy readout and simple adjustment of the signal frequency. According to the present invention, a receiver or electronics device can be designed to be more modern in appearance.

In the above example, although slits located on the circumference of the aperture for the speaker are covered with the transparent material, this invention is not limited to this application example as long as the pointer of the display unit can be seen from the outside of the case. For example, the slit itself in the circumference of the aperture for the speaker can be used as an indicator window. In the above example, reversing the mounting locations of the pointers and the tuning indicia allows the tuning indicia to be located, for example, at the indicator window of the transparent material.

Other application examples under the present invention are described in FIGS. 4 and 5. These show the rotatable tuning knob which is located around the speaker of the electronics device, and show that the pointer and the display unit are both mounted near the tuning knob for the interconnection between them.

Figure 4A:
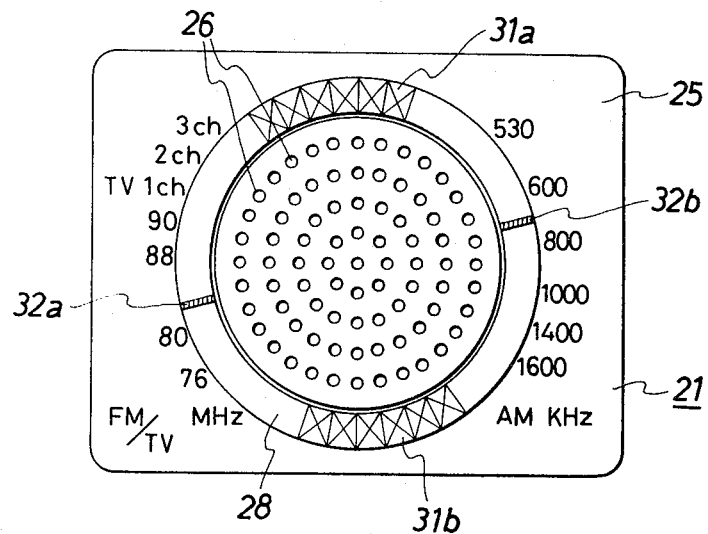
FIG. 4a is a front view of another embodiment of the invention.
Figure 4B:
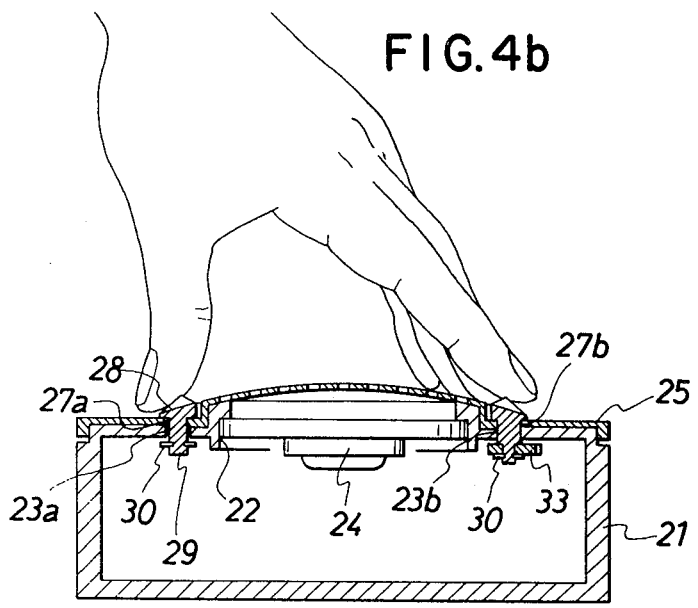

In FIGS. 4(a) and (b), wherein 21 is a case of a radio receiver, and aperture 22 for the speaker is formed roughly at the center of case 21. A pair of arched slits 23a and 23b, which face each other, are formed along the circumference of aperture 22 for the speaker. Speaker 24 is mounted on the aperture 22 and as shown in FIG. 4b, a speaker panel 25 is mounted on the case 21 to cover the speaker 24. The speaker panel 25 has a spherical protrusion for the speaker 24. This protruded panel has a multiplicity of sound transmitting holes 26. Arched slits 27a and 27b are mounted on panel 25 in accordance with slits 23a and 23b.

The circular tuning knob 28 is mounted along slits 27a and 27b. A plurality of protrusions 29, which are formed on the back of tuning knob 28, are inserted into slits 27a and 27b respectively. Fitting of an E ring 30 on protrusion 29 facing to the rear of the radio receiver case 21 prevents tuning knob 28 from being dislocated from case 21, and allows the knob to be rotatable along slits 27a and 27b.

Tuning knob 28 has a pair of finger grips 31a and 31b having several quadrangular pyramidal projections on their front surface, and pointers 32a and 32b which face each other are mounted on the knob.

Dial scales for an AM, FM and/or TV receiving signal display are mounted at the outside of tuning knob 28.

Figure 5A:
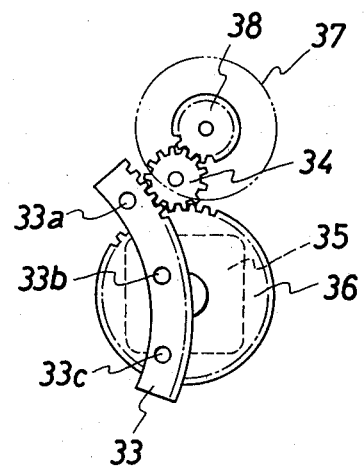
FIG. 5a is a schematic diagram showing another rotation transfer mechanism in accordance with the invention.
Figure 5B:
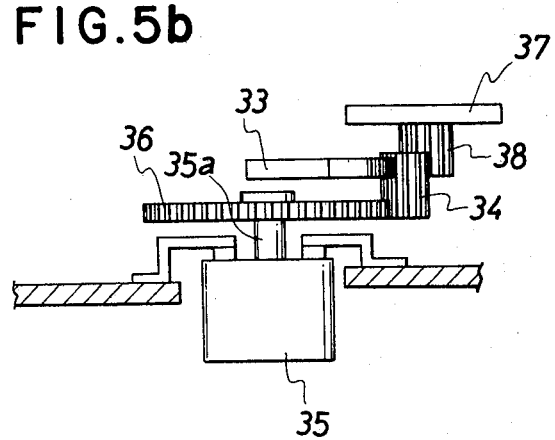

In FIG. 4(b), 33 is an arched, first gear which is fixed on the back of tuning knob 28. FIG. 5a illustrates that three mounting holes 33a through 33c, which are punched on the gear 33, can fasten the protrusion 29 which is extended from the given slits 23a and 23b. The protrusion 29 extended from knob 28 has an E ring 30 to be fixed on the knob 28.

FIGS. 5(a) and (b) also show the gear transmission mechanism which is used to interconnect the first gear 33 and the unit being controlled such as a variable capacitor 35 incorporated in the case 21. The gear transmission mechanism allows the first gear 33, which is fixed on tuning knob 28, to mesh with the second gear 36, which is fixed on rotatable shaft 35a of variable capacitor 35 via transmission gear 34.

Furthermore, the third gear 38 is connected to fine tuning knob 37 to provide a fine tune of the variable capacitor 35, and they are connected to the second gear 36 by the transmission gear 34.

When one of the AM, FM and TV frequency bands is tuned in this application example, gripping of finger grips 31a and 31b to rotate the tuning knob 28, as shown in FIG. 4b, is transferred to the first gear 33 and to the second gear 36 via transmission gear 34. The variable capacitor 35 can be adjusted and the desired radio or TV station can be easily tuned by mating pointer 32a or 32b of the tuning knob 28 with the corresponding frequency band on the scale. Further, rotating the fine-tuning knob 37 can slightly rotate the tuning knob 28 and variable capacitor 35 via transmission gear 34 for providing a fine tune.

This application also can reduce the size and thickness of the radio receiver and can provide easy readout and simple adjustment of the frequency band. As in application examples in FIGS. 1a and 1b or FIGS. 3a or 3b, modern appearance can also be maintained. The present application may be a simpler application than that shown in FIGS. 1a, 1b or FIGS. 3a, 3b.

Although the tuning knobs in FIGS. 4a, 4b or FIGS. 5a, 5b have a circular form, the present invention is not limited to this form of the knob. The circular, tuning knob having a spherical protrusion, at which a multiplicity of sound transmitting holes are formed for the speaker cover, is also applicable.

Further, in the above application, the pointer is mounted on the tuning knob and the tuning indicia is located around the tuning knob, but the present invention is applicable for a reversed layout such as a combination of the tuning indicia on the tuning knob and the pointer around the knob.

While specific embodiments of the invention have been shown and described in detail to illustrate the application of the inventive principles, it will be understood that the invention may be embodied otherwise without departing from such principles.

What is claimed is:

1. A speaker mount and tuning assembly for an electrical receiver including a receiver casing having a front wall, a generally circular speaker built into said receiver casing and electrical tuning means in said receiver casing adapted to be actuated for tuning said receiver, said assembly comprising:

means defining a generally circular aperture in said front wall of said casing extending around said speaker concentrically therewith having said speaker mounted therein, said circular aperture and said speaker being structrually configured so that said speaker is arranged to be generally in a common plane with said front wall;

a plurality of arcuate slits extending through said front wall about said circular aperture, said arcuate slits being located radially outwardly of said speaker;

a speaker panel affixed to said casing extending with at least a part thereof covering said speaker on the exterior of said receiver casing;

a rotatable tuning ring extending around said speaker generally concentrically with said circular aperture on the exterior of said receiver casing;

projections on said tuning ring extending inwardly of said receiver casing through said arcuate slits for mounting said tuning ring in rotative operation relation on said receiver casing;

a rotation transfer mechanism operatively interconnecting said tuning ring and said tuning means to transmit rotative motion of said tuning ring to said tuning means for tuning said receiver; and tuning indicia means on said tuning ring and complementary tuning indicia means affixed relative to said casing, said tuning indicia means and said complementary tuning indicia means being arranged to be adjustably positioned relative to each other for providing an indication of the frequency to which said receiver is tuned.

2. An assembly according to claim 1 wherein part of said speaker panel extends over said receiver casing radially outwardly of said speaker and of said tuning ring, wherein said speaker panel is formed with additional arcuate slits arranged to be coextensive with said arcuate slits in said front wall of said casing, said projections on said tuning ring also extending through said additional arcuate slits, and wherein said complementary tuning indicia means are formed on said part of said speaker panel extending radially outwardly from said speaker.

3. An assembly according to claim 1 wherein said rotation transfer mechanism comprises toothed gear means arranged in meshing engagement between said rotatable tuning ring and said electrical tuning means.

4. An assembly according to claim 1 further comprising retaining means on said projections located interiorly of said casing for retaining said projections within said arcuate slits in said front wall of said casing.

5. An assembly according to claim 1 wherein said rotation transfer mechanism is connected with said projections on said tuning ring and is actuated by movement of said projections within said arcuate slits when said tuning ring is rotated for tuning said receiver.

* * * * *